United States Patent [19]

Zupancic et al.

[11] Patent Number: 4,816,498

[45] Date of Patent: Mar. 28, 1989

[54] ETHERS OF OLIGOMERIC PHENOL-DIALDEHYDE CONDENSATION PRODUCTS AND A VINYL-BENZYL COMPOUND

[75] Inventors: Joseph J. Zupancic, Bensenville, Ill.; Jean M. J. Frechet, Ithaca, N.Y.; Andrew M. Zweig, Schaumburg; Jeffery P. Conrad, Chicago, both of Ill.

[73] Assignee: Allied-Signal Inc., Morristown, N.J.

[21] Appl. No.: 126,313

[22] Filed: Nov. 30, 1987

[51] Int. Cl.[4] .......................... C08G 2/02; C08G 2/34; C08G 8/36; C08G 8/04

[52] U.S. Cl. ..................................... 522/166; 528/151; 528/154; 528/159; 528/160

[58] Field of Search ........................ 528/154, 159, 151; 522/166

[56] References Cited

U.S. PATENT DOCUMENTS 4,448,952 5/1984 Patton, Jr. et al. ................. 528/154

OTHER PUBLICATIONS

A. Eisenberg, "The Glassy State and the Glass Transition", Physical Properties of Polymers, J. E. Mark et al., editors, (American Chemical Soc.), pp. 74 et ff.

*Primary Examiner*—John Kight
*Assistant Examiner*—Frederick Krass
*Attorney, Agent, or Firm*—Thomas K. McBride; Eugene I. Snyder

[57] ABSTRACT

Oligomeric condensation products of certain dialdehydes and phenols can be end-capped with a vinylbenzyl moiety and certain other moieties, especially alkyl groups, to afford thermosetting resins particularly valuable in making laminated circuit boards. Resins prepared by the reaction of 1 molar proportion of glyoxal with from 3 to 4 molar proportions of phenol and end-capped with from 50 to 85% vinylbenzyl groups with the remainder being alkyls of 1 through 11 carbon atoms are particularly useful.

34 Claims, No Drawings

ETHERS OF OLIGOMERIC PHENOL-DIALDEHYDE CONDENSATION PRODUCTS AND A VINYL-BENZYL COMPOUND

The subject matter of this application is directed toward resins used in the manufacture of reinforced plastics. More particularly, the resins (binders) are used in the preparation of composites formed from fibers embedded in a polymer resin matrix. Even more specifically this application is directed toward the use of such resins in the preparation of circuit board laminates where the reinforcing material is glass or quartz fiber.

To overcome some mechanical and structural limitations of plastics it has become relatively commonplace to reinforce them with other components. Composites formed of various fibers embedded in a polymer resin matrix are especially useful and susceptible to enormous variation depending upon the nature of the fiber used, how the fiber is utilized, and the matrix or binder for the fibers. Materials which have been used as fibers include glass, quartz, oriented polymers such as the aramids (Kevlar TM), graphite and boron. Whatever their composition such fibers can be used as chopped or continuous filaments, and when used as continuous filaments they can all be unidirectional or woven into a fabric. The matrix can be, for example, a polyester, epoxy, polyimide, polyetherketone or polyetherimide resin as either a thermoset or thermoplastic material. The uses for such composites range from airframes to tennis rackets and from boat hulls to rocket motor casings.

A particular area of composite application is that of printed circuit boards, especially multilayer circuit boards, for mounting electronic components. The use of glass fabric as the reinforcing material has become more-or-less standard and epoxy resins are most often used as the matrix. For the fiber to exert a reinforcing action it is necessary that the fibers be completely coated with resin, and to achieve this the glass fiber often is surface treated to provide sites for chemical bonding to the resin or to its precursor or for otherwise improved adhesion to the matrix material.

Multilayer circuit boards are laminates with alternating layers of composite and etched copper sheet. A brief discussion of their manufacture will aid in appreciating the properties requisite for such boards. A woven glass fabric is first impregnated with resin by dipping the cloth in a resin solution, often referred to as the varnish solution, in what is called the A-stage. Solvent is then removed to afford a glass cloth reinforced resin, or prepreg, in what is called the B-stage. In some cases the resin in the prepreg may be partially cured, in other cases uncured, but in all cases the prepreg is a non-tacky, readily handled rigid sheet of glass cloth embedded in and coated with a resin. The finished circuit board is prepared by laminating alternating layers of prepreg and etched copper foil under conditions of temperature and pressure where resin is cured, i.e., further polymerized and crosslinked to a final infusible, insoluble stage (C-stage).

From the above brief description some necessary and desirable characteristics of the resin may be readily discerned. The circuit board will be subjected to soldering temperatures and may be operated at an elevated temperature, or experience cyclic locally elevated temperatures because of local power generation, and thus the thermal coefficient of expansion of the resin should approximate that of glass to ensure continued dimensional stability and resistance to heat distortion. The resin should have a high solubility in the varnish solution to ensure high resin loading. The varnish solution should have a sufficiently low viscosity for even coating but not too low a viscosity as to run off the fibers. It is necessary that the prepreg not be tacky so that it can be readily handled and stored. The resin is desirably non-crystalline for enhanced solubility in the varnish solution and for good film forming properties in the prepreg. The resin should have adequate flow at the C-stage so as to make void-free laminated bonds, with the curing temperature somewhat higher than the glass transition temperature ($T_g$) of the resin to afford a wider processing "window." The resin also should be chemically resistant to a corrosive environment and to water vapor. To ensure that the discrete electrical components on circuit board interact only via the etched path on the copper foil, it is desirable that the matrix have a low dielectric constant and high resistance.

The invention to be described is an amorphous, thermosetting resin which affords a varnish solution of high solids content with a viscosity leading to even coating without runoff, which affords a non-tacky prepreg, has a glass transition temperature sufficiently below the curing temperature to afford an adequate window of processing, and which shows excellent flow properties at the C-stage. The final cured resin exhibits a low dielectric constant and dissipation factor, a low coefficient of thermal expansion, and a high glass transition temperature. In short, we believe our cured resin has properties superior to those currently recognized as industry standards in the lamination of circuit boards, and thus prevents outstanding benefits.

It needs to be emphasized that although this application will stress the utilization of the resins of our invention in the production of multilayer circuit boards, the resins may be useful in fabricating composites generally. Consequently, it needs to be explicitly recognized that the resins of our invention are intended for composite manufacture without any limitations other than those imposed by the product specifications themselves.

SUMMARY OF THE INVENTION

The purpose of this invention is to prepare thermosetting resins which are suitable for use in composites, especially in laminated multilayer boards of glass fiber in polymer matrix. Another purpose of this invention is the preparation of highly crosslinked polymers arising from curing of the aforementioned thermosetting resins. An embodiment includes thermosetting resins of certain ethers of oligomeric condensation products of dialdehydes with from about 3 to 4 molar proportions of phenols. In a yet more specific embodiment the condensation product arises from phenol itself. In a more specific embodiment the ether is a mixture of a vinylbenzyl ether and an alkyl ether in a ratio from about 1:1 to about 6:1. In a still more specific embodiment the alkyl portion of the ether is a primary alkyl group containing from 1 to 10 carbon atoms. Other embodiments will become clear from the ensuing discussion.

DESCRIPTION OF THE INVENTION

This invention relates to thermosetting resins which are ethers of oligomeric condensation products of 1 molar proportion of certain dialdehydes with from about 3 to about 4 molar proportions of a phenol. More particularly, the ether moiety is randomly selected from among the vinylbenzyl moiety, alkyl moieties containing from 1 to 10 carbon atoms, cycloalkyl moieties having from 5 to about 10 carbon atoms, and the benzyl moiety, where the ratio of the vinylbenzyl to other ether moieties is at least 1:1 and may be as great as 6:1.

Our invention is related to that described in Ser. No. 947,007 where the resins were exclusively the vinylbenzyl ethers of the oligomeric condensation product of certain phenols and dialdehydes, but a purpose of this invention is to overcome two problems inherent in the resins described there. One problem was that conversion of all of the phenolic hydroxyls to the vinylbenzyl ether was extraordinarily difficult as a consequence of steric hindrance, an effect which might be anticipated to be intensified with the polyhalogenated derivatives of the condensation product. The presence of phenolic hydroxyl groups, even in amounts as small as 0.5% of the original number, is detrimental to product performance, especially as regards gel time, cure kinetics and schedule, dielectric constant and loss factor, and water absorption. The second problem is that conversion of the phenolic hydroxyls exclusively to the vinylbenzyl ether is rather costly.

There appears to be no teaching of partial substitution of an alkyl or cycloalkyl group for the vinylbenzyl moiety and in fact careful consideration of such a substitution suggests it may be ineffective. One could expect that alkyl groups as ethers would act as plasticizers leading to a lower glass transition temperature ($T_g$) and a higher coefficient of thermal expansion, both of which are undesirable. A. Eisenberg, "The Glassy State and the Glass Transition", Physical Properties of Polymers, J. E. Mark et al., editors, (American Chemical Society), pp. 74 et ff. One also could expect that partial replacement of the vinylbenzyl groups by a non-crosslinkable alkyl or cycloalkyl group would adversely effect the thermal stability of the cured product, that is, the decomposition temperature of the crosslinked polymer, as a consequence of decreased crosslinking density and introduction of weaker bonds, i.e., benzylic hydrogens, alkyl carbons, etc.

However, gratifyingly and contrary to our expectations we have found that up to about 50% of the vinylbenzyl groups can be substituted by certain alkyl or cycloalkyl groups and the benzyl group without any detrimental effect and at a considerable cost savings. The products have virtually no free phenolic hydroxyls (less than about 0.5%) have a low dielectric constant, and have excellent thermal properties.

The phenolic oligomers are the condensation products of 1 molar proportion of selected dialdehydes with from 3 to 4 molar proportions of a phenol. Although more than 4 molar proportions of a phenol can be used in the practice of this invention, no more than 4 molar proportions will react with the dialdehydes, as will be elaborated upon within.

One class of dialdehydes which may be used in this invention are the linear, terminal alkylene dialdehydes of formula $OHC(CH_2)_nCHO$ where n is 0 or an integer from 1 to 6. Such dialdehydes include glyoxal, malondialdehyde, succinidialdehyde, glutaraldehyde, adiphaldehyde, pimelaldehyde, and sebacaldehyde. Those aldehydes where n is 0–4 are particularly preferred, and glyoxal (n=0) is especially favored in the practice of this invention.

Other aldehydes which may be employed in preparation of the oligomeric condensation products include cyclopentanedialdehyde, phthalaldehyde, isophthalaldehyde, terephthalaldehyde, the hexahydrophthalaldehydes (i.e., the reduced counterpart of the phthalaldehydes where the aromatic ring has been reduced to a cyclohexane ring), cycloheptanedialdehyde, and cyclooctanedialdehyde.

The oligomers are the condensation product of 1 molar proportion of the aforementioned dialdehydes with from 3 to about 4 molar proportions of a phenol. The phenol is the general structure $R_1C_6H_4OH$ where $R_1$ is hydrogen or an alkyl group containing from 1 through about 8 carbon atoms. The most desirable phenol is phenol itself, that is, the case where $R_1$ is hydrogen. Where $R_1$ is an alkyl group it is most desirable that the alkyl group contain from 1 to about 4 carbon atoms, and cresol, the case where $R_1$ is a methyl group is another preferred species of phenol.

The condensation product is analogous to phenol-formaldehyde resins. That is, the products result from the condensation of 2 molar proportions of a phenol with each aldehyde group. In the simplest case, which can be looked as the "monomeric" product, using phenol and glyoxal to exemplify the reaction, the product has the structure

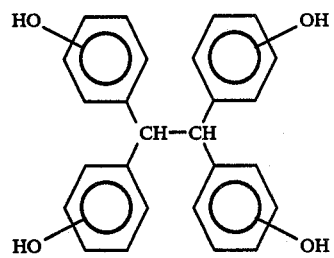

where the hydroxyls are almost exclusively ortho and para, and largely para, to the point of condensation of the phenol and glyoxal. However, the product above has 4 phenolic groups per molecule, and any one these may react with another molecule of glyoxal which then further condenses with three other molecules of phenol to give the structure,

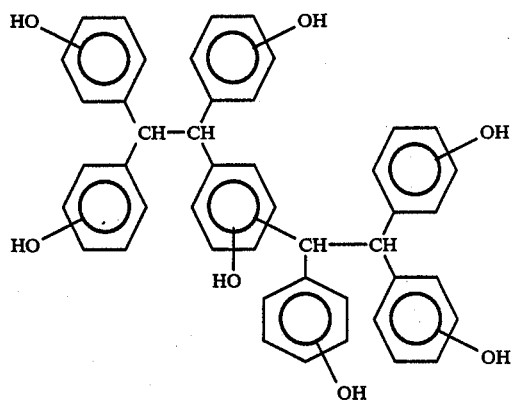

The oligomeric product above results from a molar proportion of 7 phenols to 2 glyoxals. This oligomer in turn can react with another molecule of glyoxal and the latter can react further with 3 additional phenols to give the next higher oligomer of the structure

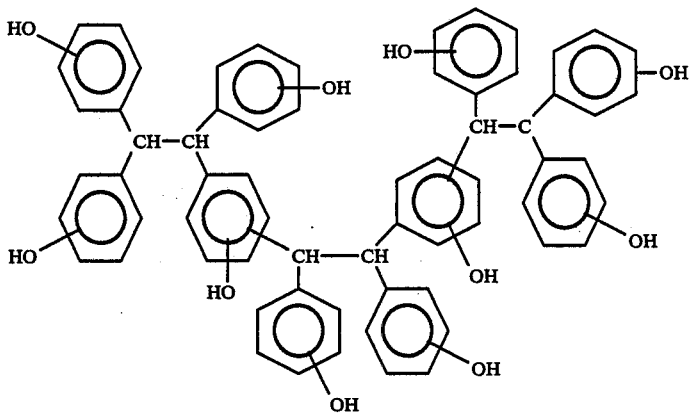

which has the molar ratio of 10 phenolic groups to 3 glyoxals. In a similar fashion, the next higher oligomer has a molar ratio of phenol to glyoxal of 13:4, the next higher of 16:5, and so forth, with the limiting molar ratio being 3:1. It needs to be mentioned that a ratio less than 3:1 will never be achieved without internal cyclization, i.e., one molecular of glyoxal is required to react with at least 2 phenolic moieties of the oligomer. In a similar fashion, the condensation product which is the "monomer" has a limiting ratio of phenol-glyoxal of 4:1.

The condensation products are themselves phenols, as mentioned above, and are a mixture of oligomers. This mixture can be characterized by the number of phenolic moieties per molecule. In the practice of this invention we are concerned with those condensation products which have from 4 to about 60 phenolic moieties per molecule, and more usually between four and about 22 phenolic moieties per molecule. The product being a mixture of oligomers, the preferred mixture is characterized by having as an average between about 5 and about 8 phenolic moieties per molecule.

More specifically, where the dialdehyde is glyoxal and the phenol is phenol itself each oligomeric product has a molecular weight between about 400 and 6000, and more desirably between about 400 and about 2200. The mixture of oligomeric products may be characterized by an average molecular weight of between about 500 and about 800.

The thermosetting resins of this invention are ethers of the aforedescribed oligomeric condensation products. In one variant of our invention the phenolic condensation products are halogenated prior to ether formation in order to make the final resins more flame retardant. Increased flame retardancy occurs especially when the halogen is chlorine or bromine, and the use of a brominated product is preferred. The halogen is introduced into positions ortho and para to the phenolic hydroxyl group. If all of the ortho and para positions are available a maximum of three halogen atoms per phenolic moiety may be introduced. Often it is desirable to prepare the maximally halogenated oligomeric condensation product, although at times a halogen content less than the maximum is advantageous. However, in the latter variant it should be clear that there is at least one chlorine or bromine atom per phenolic moiety. The phenolic condensation products are capped so as to convert substantially all (greater than about 99.5%) of the hydroxyls to ether moieties. Each of the ether moieties is randomly selected from the group consisting of vinylbenzyl, alkyl containing 1 to 10 carbon atoms, cycloalkyl of from 5 to 10 carbon atoms, and benzyl moieties where the ratio of the vinylbenzyl to all other ether moieties is at least 1:1 and may be as high as 6:1. The vinylbenzyl moiety has the structure

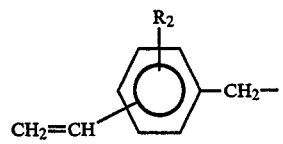

where the vinyl group is either meta or para to the $CH_2$, and which usually is a mixture of the meta and para-isomers. $R_2$ is a chemically inert substituent selected from the group consisting of hydrogen, alkyl moieties containing from 1 to about 10 carbon atoms, the halogens, alkoxy moieties containing from 1 to about 10 carbon atoms, and monovalent radicals whose parent is an aromatic hydrocarbon. In the usual case $R_2$ is hydrogen.

The other ether groups which may be used in the practice of this invention include an alkyl group containing from 1 to 10 carbons, a cycloalkyl group having 5 to 10 carbons, or benzyl group. Where the ether moiety is an alkyl group, the lower alkyl groups containing from 1 to 4 carbon atoms are given priority, especially the primary alkyl groups. Thus, the most desirable alkyl groups consist of methyl, ethyl, 1-propyl, 1-butyl, and 2-methyl-1-propyl. Other alkyl groups are represented by 1-pentyl, 1-hexyl, 1-heptyl, 1-octyl, 1-nonyl, 1-decyl, 2-methyl-1-butyl, 3-methyl-1-butyl, 2,3-dimethyl-1-butyl, 3,3-dimethyl-1-butyl, 2-methyl-1-pentyl, and so forth. However, it is to be emphasized that a benzyl group also operates quite satisfactorily in the practice of our invention. The most common cycloalkyl groups used in our invention are 5- and 6-membered cycloalkanes, unsubstituted or alkyl substituted so as to contain 5 to 10 carbon atoms. Examples are cyclopentyl, cyclohexyl, methylcyclopentyl, dimethylcyclopentyl, ethylcyclopentyl, propylcyclopentyl, butylcyclopentyl, pentylcyclopentyl, ethylmethylcyclopentyl, methylpropylcyclopentyl, butylmethylcyclopentyl, methylcyclohexyl, dimethylcyclohexyl, ethylcyclohexyl, propylcyclohexyl, butylcyclohexyl, and so forth. Alkyl groups containing 1 through about 4 carbon atoms are especially desirable, and among these the primary alkyl groups are particularly favored. It also needs to be mentioned that the vinylbenzyl and other moieties are randomly distributed among the aromatic rings.

The appended vinyl groups are readily crosslinked in a curing step effected by thermal, chemical, or radiative means. Thermal curing is generally done in the temperature range between about 110° and about 250° C., and in practice multilayer boards may be laminated at a temperature between about 150° and about 200° C. for 0.5–5 hours with post curing at about 180°–250° C. for about 0.5–24 hours. Curing also may be brought about using a free radical initiator, such as azo-bis-isobutyronitrile, benzoyl peroxide, di-t-butyl peroxide, etc. Curing may be effected as well by irradiation, especially by visible and ultraviolet light in the presence of a suitable photoinitiator. Whether thermal, chemical, or photochemical curing is performed, the resin becomes extensively crosslinked and sets to an infusible, insoluble glassy solid.

The resins of this invention may be prepared by any convenient method known in the art. The ethers are most readily prepared by reacting a vinylbenzyl halide with the phenolic condensation products followed by reaction of the partially etherified material with another suitable halide, such as an alkyl halide. However, an alternative to the sequential reaction is a reaction of a mixture of a vinylbenzyl halide with the oligomeric condensation products. Generally a mixture of the meta- and para-isomers of vinylbenzyl chloride are used, where the bromide and, to a lesser extent, the iodide also may be used. The reaction may be conveniently performed in an alcoholic potassium hydroxide solution, often containing an acetone or some other organic cosolvent, at the reflux temperature.

The materials of our invention also can be blended with other types of vinylbenzyl ethers of functionality greater than or equal to 2 to provide A-stage varnish solutions with tailorable viscosity and variable properties in the cured product such as glass transition temperature, heat distortion temperature, fracture toughness, etc. For example, our resins could be blended with various styrenated bisphenols to raise crosslink density and improve processability of the bis-styryl compound. The materials of our invention are polymers of moderate functionality (i.e., number of vinylbenzyl groups per molecule) and viscosity and they can be incorporated to reduce crystallinity of various styrenated bisphenols where the bisphenols are exemplified by the formula

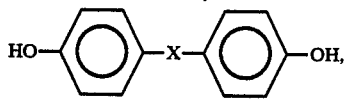

with X being —O—, —C(CH$_3$)$_2$—, —SO$_2$—, —O—, —CO—, and so forth to raise the resin solids content in the A-stage varnish solution, to raise the resin content in the B-stage, and to reduce the amount of resin flow in the C-stage. High-to-moderate molecular weight poly(vinylbenzyl ethers) also may be useful for improving the shelf life of other styrenated oligomers, and may raise the ductility of the otherwise brittle laminate, such as in the case of styrenated bisphenol A.

The following examples are only illustrative of this invention. Materials used therein are to be construed as only representative of those which can be used in the practice of our invention, and are not a limitation of the invention as claimed.

EXAMPLE I

Synthesis of Styrene-Terminated Tetraphenol Ethane (70% Vinylbenzyl/30% Propyl) (STTPE(70 VBz/30 Pr))

To a 250 ml round bottom, 3 neck flask equipped with a stirring shaft, an addition funnel and a condenser was added 25.0 g tetraphenol ethane (TPE) (Mn=274, Mw=711) (0.0354 mol), 0.23 g BHT (0.00106 mol) and 120 ml N-methyl pyrollidinone (NMP). Upon dissolution of the TPE, 26.48 g vinylbenzyl chloride (VBC) (0.174 mol) were added and the vessel flushed and placed under positive nitrogen pressure by means of a mineral oil bubbler. The solution was heated to 60° C. by means of a water bath and 11.34 g KOH (0.177 mol) dissolved in 25 ml of methanol were added dropwise over 30 minutes. The mixture was kept at 60° C. for an additional 3.5 hours. 9.0 ml 1-bromopropane (0.099 mol) were then added. 4.86 g KOH (0.0758 mol) dissolved in 11 ml methanol were then added dropwise over 30 minutes and the temperature maintained at 50° C. an additional 1.5 hours.

The mixture was cooled and slowly added to 600 ml of methanol leaving a solid yellow mass. The methanol was decanted and the solids along with fresh methanol were placed in a blender to produce an oily solid which was collected on a Buchner funnel. This material was dissolved in dichloromethane and washed with 4×500 ml water. The organic phase was dried over sodium sulfate and filtered through Celite. Solvent was removed by rotary evaporation leaving an orange semi-solid, 49% yield. GPC examination of resin indicates Mn=1040, Mw=1290, dispersity 1.24. Infrared examination of resin indicates some residual OH (<5%), ion chromatography indicates: 17 ppm Cl$^-$, <1 ppm Br$^-$, 1 ppm SO$_4^{-2}$. 3.0 g of STTPE (70 VBz/30 Pr) was dissolved in ca. 5 ml of acetone and cured in a flat mold by heating at 80° C. for 2 hours, 100° C. for 16 hours, 120° C. for 4 hours, 160° C. for 16 hours, 200° C. for 4 hours then 225° C. for 1 hour. Analysis of the cured polymer disclosed the following properties.

TABLE 1

| Tg(°C.)[a] DSC | Tsp(°C.)[b] TMA | $a_g$[c] (ppm/°C.) | $a_{260}$[d] (ppm/°C.) | $\epsilon'$/tan$\delta$[e] 0% RH[f] | $\epsilon'$/tan$\delta$[e] 50% RH | H2O[g] absorption (wt %) |
|---|---|---|---|---|---|---|
| >300 | 167 ± 13 | 60 ± 2 | 79 ± 2 | 3.07/0.001 | 3.29/0.007 | 0.15 |

[a]Glass transition temperature.
[b]Softening point.
[c]Coefficient of thermal expansion from 25° C. to Tsp.
[d]Coefficient of thermal expansion from 25° C. to 260° C.
[e]$\epsilon'$ is the dielectric constant, tan$\delta$ the dissipation factor, measured at 1 MHz, 25° C. two-fluid cell.
[f]Relative humidity.
[g]Weight gain after two weeks at 50% relative humidity.

EXAMPLE II

Synthesis of Styrene Terminated Tetraphenol Ethane (70% Vinylbenzyl/30% Propyl) STTPE (70 VBz/30 Pr))

To a 1 L round bottom, 3 neck flask equipped with a stirring shaft, an addition funnel and a condenser was added 50.0 g tetraphenol ethane (TPE) (Mn=274, Mw=711) (0.0708 mol). 0.47 g BHT (0.00212 mol) and 240 ml N-methylpyrollidinone (NMP). Upon dissolution of the TPE, 52.96 g vinylbenzyl chloride (VBC) (0.347 mol) were added and the vessel flushed and placed under positive nitrogen pressure by means of a mineral oil bubbler. The solution was heated to 60° C. by means of a water bath and 22.70 g KOH (0.354 mol) dissolved in 60 ml of methanol were added dropwise over 30 minutes. The mixture was kept at 60° C. for an additional 3 hours. 13.5 ml 1-bromopropane (0.149 mol) were then added. 10.2 g KOH (0.158 mol) dissolved in 25 ml methanol were then added dropwise over 15 minutes and the temperature maintained at 60° C. an additional 1.75 hours. An additional 9.0 ml 1-bromopropane were added followed by 6.35 g KOH (0.099 mol) dissolved in 20 ml methanol which were added dropwise over 20 minutes. The mixture was maintained at 60° C. for an additional hour.

The mixture was cooled and slowly added to 5 L of methanol leaving a solid yellow mass. The methanol was decanted and the solids along with fresh methanol were placed in a blender to produce an oily solid which was collected on a Buchner funnel. This material was dissolved in dichloromethane an washed with 4×500 ml water. The organic phase was dried over sodium sulfate and filtered through Celite. Solvent was removed by rotary evaporation leaving an orange semi-solid, 57% yield. GPC analysis indicates resin to have Mn=899, Mw=2410, dispersity 2.68; Infrared analysis indicates low residual OH (21 5%) Ion Chromatography analysis indicates: 13 ppm Cl−, <1 ppm Br−, 26 ppm $SO_4^{-2}$. STTPE (70VBz/30 PR) was cured according to the aforementioned cure cycles. Samples are identified as follows:

A: Cast from toluene
B: Cast from acetone

EXAMPLE III

Synthesis of Styrene Terminated Tetraphenol Ethane (50% Vinylbenzyl/50% Propyl) (STTPE (50 VBz/50 Pr))

To a 2 L, 3 neck round bottom flask equipped with a stirring shaft, an addition funnel and a condenser was added 100.0 g tetraphenol ethane (TPE) (Mn=273, Mw=711) (0.142 mol), 0.94 g BHT (0.00426 mol) and 475 ml N-methyl pyrollidinone (NMP). Upon dissolution of the TPE, 75.66 g vinylbenzyl chloride (VBC) (0.496 mol) were added and the vessel flushed and placed under positive nitrogen pressure by means of a mineral oil bubbler. The solution was heated to 60° C. by means of a water bath and 32.44 KOH (0.506 mol) dissolved in 75 ml of methanol were added dropwise over 30 minutes. The mixture was kept at 60° C. for an additional 3 hours. 54.0 ml 1-bromopropane (0.595 mol) were then added. 32.44 KOH (0.506 mol) dissolved in 75 ml methanol were then added dropwise over 30 minutes and the temperature maintained at 60° C. an additional 2.5 hours.

The mixture was cooled and slowly added to 7.5 L of rapidly stirred methanol leaving a solid yellow mass. The methanol was decanted and the solids along with fresh methanol were placed in a blender to produce an oily solid which was collected on a Buchner funnel. This material was dissolved in dichloromethane and washed with 3×500 ml water. The organic phase was dried over sodium sulfate and filtered through Celite. Solvent was removed by rotary evaporation leaving an orange semi-solid, 53% yield. GPC analysis of the resin indicates Mn=797, Mw=1076, dispersity 1.35; Infrared analysis indicates the presence of very small residual OH (<2%); Ion Chromatography analysis found; 9 ppm Cl−, <1 ppm Br−, 79 ppm $SO_4^{-2}$. STTPE (50 VBz/50 Pr) was cast and cured according to curing procedure hereinbefore set forth in the above examples. Samples are identified as follows.

A: Cast from acetone
B: Cast from toluene

TABLE 2

| Sample | $Tg(°C.)^a$ DSC | $Tsp(°C.)^b$ TMA | $\alpha_g^c$ (ppm/°C.) | $\overline{\alpha}_{260}^d$ (ppm/°C.) | $\epsilon'/\tan\delta^e$ 0% $RH^f$ | $\epsilon'/\tan\delta^e$ 50% RH | $H_2O^g$ absorption (wt %) |
|---|---|---|---|---|---|---|---|
| A | >300 | 167 ± 11 | 62 ± 5 | 66 ± 4 | 3.07/0.002 | 3.13/0.005 | 0.46 |
| B | >300 | $^h$ | $^h$ | 51 ± 2 | 3.06/0.003 | 2.73/0.007 | 0.21 |

$^a$Glass transition temperature.
$^b$Softening point.
$^c$Coefficient of thermal expansion from 25° C. to Tsp.
$^d$Coefficient of thermal expansion from 25° C. to 260° C.
$^e\epsilon'$ is the dielectric constant, tan$\delta$ the dissipation factor, measured at 1 MHz, 25° C., two-fluid cell.
$^f$Relative humidity.
$^g$Weight gain after two weeks at 50% relative humidity.
$^h$Not observed

TABLE 3

| Sample | $Tg(°C.)^a$ DSC | $Tsp(°C.)^b$ TMA | $\alpha_g^c$ (ppm/°C.) | $\overline{\alpha}_{260}^d$ (ppm/°C.) | $\epsilon'/\tan\delta^e$ 0% RH | $\epsilon'/\tan\delta^e$ 50% RH | $H_2O^g$ absorption (wt %) |
|---|---|---|---|---|---|---|---|
| A | >300 | 134 ± 5 | 68 ± 1 | 79 ± 1 | 3.10/0.003 | 3.24/0.005 | 0.13 |
| B | >300 | 230 ± 4 | 77 ± 2 | 84 ± 2 | 3.00/0.002 | 3.21/0.005 | 0.07 |

$^a$Glass transition temperature.
$^b$Softening point.
$^c$Coefficient of thermal expansion from 25° C. to Tsp.
$^d$Coefficient of thermal expansion from 25° C. to 260° C.
$^e\epsilon'$ is the dielectric constant, tan$\delta$ the dissipation factor, measured at 1 MHz, 25° C., two-fluid cell.
$^f$Realtive humidity.
$^g$Weight gain after two weeks at 50% relative humidity.

EXAMPLE IV

Synthesis of Styrene Terminated Tetraphenol Ethane (50% Vinylbenzyl/50% Hexyl) (STTPE (50 VBz/50 Hx))

To a 2 L, 3 neck round bottom flask equipped with a stirring shaft, an addition funnel and a condenser was added 100.0 g tetraphenol ethane (TPE) (Mn=274, Mw=711) (0.142 mol), 0.94 g BHT (0.00426 mol) and 475 ml N-methyl pyrollidinone (NMP). Upon dissolution of the TPE, 75.66 g vinylbenzyl chloride (VBC) (0.496 mol) were added and the vessel flushed and placed under positive nitrogen pressure by means of a mineral oil bubbler. The solution was heated to 60° C. by means of a water bath and 32.44 g KOH (0.506 mol) dissolved in 75 ml of methanol were added dropwise over 30 minutes. The mixture was kept at 60° C. for an additional 3 hours. 83.5 ml 1-bromohexane (0.595 mol) were then added. 32.44 g KOH (0.506 mol) dissolved in 75 ml methanol were then added dropwise over 30 minutes and the temperature maintained at 60° C. an additional 2.5 hours.

The mixture was cooled and slowly added to 7.5 L of rapidly stirred methanol leaving an oil that gradually settled out. The methanol was decanted and the oil was dissolved in dichloromethane and washed with 3×500 ml water. The organic phase was dried over sodium sulfate and filtered through Celite. Solvent was removed by rotary evaporation leaving a brown oil, 55% yield. GPC analysis indicates Mn=924, Mw=1217, dispersity 1.32; Infrared analysis indicates no residual OH (<.5%); Ion Chromatography analysis found: 7 ppm Cl$^-$, <3 ppm Br$^-$, 64 ppm SO$_4^{-2}$. STTPE (50 VBz/50 Hx) was cast and cured according to the curing procedure hereinbefore set forth in the above examples. Samples are identified as follows:
A: Cast from acetone
B: Cast from toluene Mw=711) (0.212 mol), 1.40 g BHT (0.00637 mol) and 700 ml N-methyl pyrollidinone (NMP). Upon dissolution of the TPE, 113.24 g vinylbenzyl chloride (VBC) (0.742 mol) were added and the vessel flushed and placed under positive nitrogen pressure by means of a mineral oil bubbler. The solution was heated to 60° C. by means of a water bath and 47.58 g KOH (0.742 mol) dissolved in 110 ml of methanol were added dropwise over 30 minutes. The mixture was kept at 60° C. for an additional 2.25 hours. 94.0 ml benzyl chloride (0.816 mol) were then added. 47.58 g KOH (0.742 m mol) dissolved in 110 ml methanol were then added dropwise over 30 minutes and the temperature maintained at 60° C. an additional 3 hours.

The mixture was cooled and divided into two fractions. The first fraction A was mixed with 750 ml dichloromethane and washed with 2×2 L water and 2×2 L 0.5M NaCl (aq). The second fraction B was slowly added to 5 L of rapidly stirred methanol leaving an oily mass. The methanol was decanted and the oil was dissolved in dichloromethane and washed with 3×1 L water. The organic phase from each fraction was dried over sodium sulfate and filtered through Celite. Solvent was removed by rotary evaporation leaving an oil for sample A (STTPE (50 VBz/50 Bz)-A) and a semi-solid for sample B (STTPE (50 VBz/50 Bz)-B). The overall yield (fractions A and B combined) of the reaction was 66%. Analysis of fraction A found: Mn=761, Mw=3890, dispersity 5.11; Infrared analysis indicates no residual OH (<0.5%); Ion Chromatography analysis found; 18 ppm Cl$^-$ <3 ppm Br$^-$, 9 ppm SO$_4^{-2}$. Analysis of fraction B found: Mn=921, Mw=1560, dispersity 1.69; Infrared analysis indicates no residual OH (<0.5%); Ion Chromatography shows: 12 ppm Cl$^-$, <3 ppm Br$^-$, 11 ppm SO$_4^{-2}$. STTPE (50 VBz/50 Bz)-A and STTPE (50 VBz/50 Bz)-B were cured according to the aforementioned curing schedule set forth in the above examples. Samples are identified as follows:

A: STTPE (50 VBz/50 Bz)-A Cast from acetone.
B: STTPE (50 VBz/50 Bz)-A Cast from toluene.
C: STTPE (50 VBz/50 Bz)-A Cast neat with no solvent.
D: STTPE (50 VBz/50 Bz)-B Cast from acetone.
E: STTPE (50 VBz/50 Bz)-B Cast from toluene.

TABLE 4

| Sample | Tg(°C.)[a] DSC | Tsp(°C.)[b] TMA | $\bar{\alpha}_g{}^c$ (ppm/°C.) | $\alpha_{260}{}^d$ (ppm/°C.) | $\epsilon'/\tan\delta^e$ 0% RH | $\epsilon'/\tan\delta^e$ 50% RH | H2O[g] absorption (wt %) |
|---|---|---|---|---|---|---|---|
| A | >300 | 90 ± 15 | 86 ± 5 | 107 ± 1 | 3.08/0.005 | 3.13/0.006 | 0.12 |
| B | >300 | 131 ± 13 | 79 ± 1 | 113 ± 4 | 2.99/0.005 | 3.17 0.007 | 0.13 |

[a]Glass transition temperature.
[b]Softening point.
[c]Coefficient of thermal expansion from 25° C. to Tsp.
[d]Coefficient of thermal expansion from 25° C. to 260° C.
[e]$\epsilon'$ is the dielectric constant, tan$\delta$ the dissipation factor, measured at 1 MHz, 25° C., two-fluid cell.
[f]Relative humidity.
[g]Weight gain after two weeks at 50% relative humidity.

EXAMPLE V

Synthesis of Styrene Terminated Tetraphenol Ethane (50% Vinylbenzyl/50% Benzyl (STTPE (50 VBZ/50 Bz))

To a 2 L, 3 neck round bottom flask equipped with a stirring shaft, an addition funnel and a condenser was added 150.0 g tetraphenol ethane (TPE) (Mn=274,

TABLE 5

| Sample | Tg(°C.)[a] DSC | Tsp(°C.)[b] TMA | $\bar{\alpha}_g{}^c$ (ppm/°C.) | $\alpha_{260}{}^d$ (ppm/°C.) | $\epsilon'/\tan\delta^e$ 0% RH | $\epsilon'/\tan\delta^e$ 50% RH | H2O[g] absorption (wt %) |
|---|---|---|---|---|---|---|---|
| A | >300 | 153 ± 5 | 64 ± 5 | 92 ± 5 | 3.08/0.001 | 3.12/0.001 | 0.15 |
| B | >300 | 151 ± 9 | 68 ± 6 | 93 ± 6 | 2.97/0.003 | 3.10 0.002 | 0.16 |
| C | >300 | 152 ± 9 | 59 ± 2 | 86 ± 4 | 2.95/0.002 | 3.17/0.001 | 0.13 |
| D | >300 | 140 ± 4 | 60 ± 2 | 83 ± 5 | 3.02/0.002 | 3.07 0.003 | 0.42 |

TABLE 5-continued

| Sample | Tg(°C.)[a] DSC | Tsp(°C.)[b] TMA | $\bar{a}_g$[c] (ppm/°C.) | $\bar{a}_{260}$[d] (ppm/°C.) | ε'/tanδ[e] 0% RH | ε'/tanδ[e] 50% RH | H2O[g] absorption (wt %) |
|---|---|---|---|---|---|---|---|
| E | >300 | 160 ± 5 | 58 ± 2 | 88 ± 2 | 2.92/0.002 | 3.03/0.003 | 0.12 |

[a]Glass transition temperature.
[b]Softening point.
[c]Coefficient of thermal expansion from 25° C. to Tsp.
[d]Coefficient of thermal expansion from 25° C. to 260° C.
[e]ε' is the dielectric constant, tanδ the dissipation factor, measured at 1MHz, 25° C., two-fluid cell.
[f]Relative humidity.
[g]Weight gain after two weeks at 50% relative humidity.

EXAMPLE VI

Synthesis of Styrene Terminated Tetraphenol Ethane (70% Vinylbenzyl/30% Propyl) (STTPE (70 VBz/30 Pr))

To a 2 L, 3 neck round bottom flask equipped with a stirring shaft, an addition funnel and a condenser was added 150.0 g tetraphenol ethane (TPE) (Mn=274, Mw=711) (0.212 mol), 1.40 g BHT (0.00637 mol) and 700 ml N-methyl pyrollidinone (NMP). Upon dissolution of the TPE, 158.53 g vinylbenzyl chloride (VBC) (1.04 moL) were added and the vessel flushed and placed under positive nitrogen pressure by means of a mineral oil bubbler. The solution was heated to 60° C. by a water bath and 68.02 g KOH (1.06 mol) dissolved in 150 ml of methanol were added dropwise over 30 minutes. The mixture was kept at 60° C. for an additional 3.5 hours. 54.0 ml 1-bromopropane (0.595 mol) were then added. 29.12 g KOH (0.454 mol) dissolved in 65 ml methanol were then added dropwise over 30 minutes and the temperature maintained at 60° C. an additional 2 hours.

The mixture was cooled and 1 L dichloromethane added. The mixture was washed with 4×2.5 L water, dried over sodium sulfate and filtered through Celite. Solvent was removed by rotary evaporation up to 40° C. at 3 torr leaving an extremely viscous brown resin, 84% yield. GPC analysis found Mn=766, Mw=3010, dispersity 3.93; Infrared analysis indicates no residual OH (<0.5%); Ion Chromatography found: 9 ppm Cl−, 3 ppm Br−, 25 ppm SO4−2. STTPE (70 VBz/30 Pr) was cast and cured according to the curing procedure hereinbefore set forth in the above examples. Samples are identified as follows:
A: Cast from toluene
B: Cast from acetone.

EXAMPLE VII

Synthesis of Styrene Terminated Tetraphenol Ethane (70% Vinylbenzyl/30% Benzyl) (STTPE (70 VBz/30 Bz))

To a 2 L, 3 neck round bottom flask equipped with a stirring shaft, an addition funnel and a condenser was added 100.0 g tetraphenol ethane (TPE) (Mn=274, Mw=711) (0.142 mol), 0.94 g BHT (0.00425 mol) and 475 ml N-methyl pyrollidinone (NMP). Upon dissolution of the TPE, 99.06 g vinylbenzyl chloride (VBC) (0.649 mol) were added and the vessel flushed and placed under positive nitrogen pressure by means of a mineral oil bubbler. The solution was heated to 60° C. by a water bath and 42.45 g KOH (0.662 mol) dissolved in 95 ml of methanol were added dropwise over 30 minutes. The mixture was kept as 60° C. for an additional 3.5 hours. 34.0 ml benzyl chloride (0.297 mol) were then added. 18.20 g KOH (0.283 mol) dissolved in 40 ml methanol were then added dropwise over 30 minutes and the temperature maintained at 60° C. an additional 1.5 hours.

The mixture was cooled and 700 ml toluene were added. The mixture was washed with 2×1.8 L water and 2×1.8 L 1M NaCl (aq). The organic phase was dried over sodium sulfate and filtered through Celite. Solvent was removed by rotary evaporation up to 40° C. at 3 torr leaving a viscous brown resin, 102% yield. GPC analysis found Mn=678, Mw=1020, dispersity 1.51; Infrared analysis indicates no residual hydroxyl (<0.5%); Ion Chromatography found; 16 ppm Cl−, <1 ppm Br−, 5 ppm SO4−2. STTPE (70 VBZ/30 Bz) was cast and cured according to curing procedure hereinbefore set forth in the above examples. Samples are identified as follows.
A: Cast from acetone

TABLE 6

| Sample | Tg(°C.)[a] DSC | Tsp(°C.)[b] TMA | $\bar{a}_g$[c] (ppm/°C.) | $\bar{a}_{260}$[d] (ppm/°C.) | ε'/tanδ[e] 0% RH | ε'/tanδ[e] 50% RH | H2O[g] absorption (wt %) |
|---|---|---|---|---|---|---|---|
| A | >300 | 197 ± 2 | 60 ± 1 | 67 ± 3 | 2.98/0.003 | 3.02/0.007 | 0.16 |
| B | >300 | 171 ± 5 | 52 ± 2 | 65 ± 3 | 2.98/0.006 | 3.02 0.004 | 0.18 |

[a]Glass transition temperature.
[b]Softening point.
[c]Coefficient of thermal expansion from 25° C. to Tsp.
[d]Coefficient of thermal expansion from 25° C. to 260° C.
[e]ε' is the dielectric constant, tanδ the dissipation factor, measured at 1 MHz, 25° C., two-fluid cell.
[f]Relative humidity.
[g]Weight gain after two weeks at 50% relative humidity.

B: Cast neat without solvent.

TABLE 7

| Sample | Tg(°C.)[a] DSC | Tsp(°C.)[b] TMA | $\bar{a}_g$[c] (ppm/°C.) | $\bar{a}_{260}$[d] (ppm/°C.) | ε'/tanδ[e] 0% RH | ε'/tanδ[e] 50% RH | H2O[g] absorption (wt %) |
|---|---|---|---|---|---|---|---|
| A | >300 | 171 ± 2 | 49 ± 3 | 66 ± 1 | 2.94/0.036 | 3.14/0.009 | 0.14 |
| B | >300 | 128 ± 6 | 66 ± 10 | 89 ± 4 | 3.00/0.059 | 3.04 | 0.13 |

TABLE 7-continued

| Sample | Tg(°C.)[a] DSC | Tsp(°C.)[b] TMA | $\bar{a}_g$[c] (ppm/°C.) | $\bar{a}_{260}$[d] (ppm/°C.) | $\epsilon'/\tan\delta$[e] 0% RH | 50% RH | H2O[g] absorption (wt %) |
| --- | --- | --- | --- | --- | --- | --- | --- |
|  |  |  |  |  |  | 0.006 |  |

[a] Glass transition temperature.
[b] Softening point.
[c] Coefficient of thermal expansion from 25° C. to Tsp.
[d] Coefficient of thermal expansion from 25° C. to 260° C.
[e] $\epsilon'$ is the dielectric constant, tan δ the dissipation factor, measured at 1 MHz, 25° C., two-fluid cell.
[f] Relative humididity.
[g] Weight gain after two weeks at 50% relative humidity.

EXAMPLE VIII

Synthesis of Styrene Terminated Tetraphenol Ethane (50% Vinylbenzyl/50% Propyl) (STTPE (50 VBz/50 Pr))

To a 2 L, 3 neck round bottom flask equipped with a stirring shaft, an addition funnel and a condenser was added 100.0 g tetraphenol ethane (TPE) (Mn=274, Mw=711) (0.142 mol), 0.94 g BHT (0.00425 mol) and 475 ml N-methyl pyrollidinone (NMP). Upon dissolution of the TPE, 70.58 g vinylbenzyl chloride (VBC) (0.462 mol) were added and the vessel flushed and placed under positive nitrogen pressure by means of a mineral oil bubbler. The solution was heated to 60° C. by a water bath and 30.22 g KOH (0.471 mol) dissolved in 70 ml of methanol were added dropwise over 30 minutes. The mixture was kept at 60° C. for an additional 2.5 hours. 50.4 ml 1-bromopropane (0.555 mol) were then added. 30.22 g KOH (0.471 mol) dissolved in 70 ml methanol were then added dropwise over 30 minutes and the temperature maintained at 60° C. an additional 3 hours.

The mixture was cooled and 700 ml dichloromethane added. The mixture was washed with 2×1.75 L water and 2×1.75 L 1M NaCl (aq). The organic phase was dried over sodium sulfate and filtered through Celite. Solvent was removed by rotary evaporation up to 40° C. at 3 torr leaving an extremely viscous brown resin, 96% yield. GPC analysis found Mn=642, Mw=921, dispersity 1.44; Infrared analysis indicates no residual hydroxyl (<0.5%); Ion Chromatography analysis found: 4 ppm Cl−, <25 ppm Br−, <25 ppm SO4−2. STTPE (50 VBz/50 Pr) was cast and cured according to curing procedure hereinbefore set forth in the above examples. Samples are identified as follows:
A: Cast from acetone
B: Cast neat without solvent

EXAMPLE IX

Synthesis of Styrene Terminated Tetraphenol Ethane (70% Vinylbenzyl/30% Propyl) (STTPE (70 VBz/30 Pr))

To a 3 L, 3 neck round bottom flask equipped with a stirring shaft, an additional funnel and a condenser was added 353.0 g tetraphenol ethane (TPE) (Mn=274, Mw=711) (0.500 mol), 3.30 g BHT (0.0150 mol) ad 1670 ml N-methyl pyrollidinone (NMP). Upon dissolution of the TPE, 373.89 g vinylbenzyl chloride (VBC) (2.45 mol) were added and the vessel flushed and placed under positive nitrogen pressure by means of a mineral oil bubbler. The solution was heated to 60° C. by a water bath and 160.25 g KOH (2.50 mol) dissolved in 360 ml of methanol were added dropwise over 30 minutes. The mixture was kept at 60° C. for an additional 3.5 hours. 127 ml 1-bromopropane (1.40 mol) were then added. 68.68 g KOH (1.07 mol) dissolved in 150 ml methanol were then added dropwise over 30 minutes and the temperature maintained at 60° C. an additional 1.5 hours.

The mixture was cooled and 2.5 L dichloromethane were added. The mixture was washed with 3×6.25 L water and 6.25 L 1M NaCl (aq). The organic phase was dried over sodium sulfate and filtered through Celite. Solvent was removed by rotary evaporation up to 40° C. at 3 torr leaving an extremely viscous brown resin, 92% yield. GPC analysis found Mn=696, Mw=1000, dispersity 1.44; Infrared analysis found no residual hydroxyl (<0.5%); Ion Chromatography analysis found; 6 ppm Cl−, <25 ppm Br−, <25 ppm SO4−2. STTPE (70 Bz/30 Pr) was cured according to curing procedure hereinbefore set forth in the above examples. Samples are identified as follows:
A: Cast from acetone
B: Cast from toluene

8

| Sample | Tg(°C.)[a] DSC | Tsp(°C.)[b] TMA | $\bar{a}_g$[c] (ppm/°C.) | $\bar{a}_{260}$[d] (ppm/°C.) | $\epsilon'/\tan\delta$[e] 0% RH | 50% RH | H2O[g] absorption (wt %) |
| --- | --- | --- | --- | --- | --- | --- | --- |
| A | >300 | 140 ± 4 | 75 ± 3 | 103 ± 3 | 3.03/0.006 | 3.08/0.008 | 0.10 |
| B | >300 | 115 ± 9 | 81 ± 7 | 118 ± 5 | 2.99/0.001 | 3.02 0.044 | 0.02 |

[a] Glass transition temperature.
[b] Softening point.
[c] Coefficient of thermal expansion from 25° C. to Tsp.
[d] Coefficient of thermal expansion from 25° C. to 260° C.
[e] $\epsilon'$ is the dielectric constant, tan δ the dissipation factor, measured at 1 MHz, 25° C., two-fluid cell.
[f] Relative humidity.
[g] Weight gain after two weeks at 50% relative humidity.

TABLE 9

| Sample | Tg(°C.)[a] DSC | Tsp(°C.)[b] TMA | $\bar{a}_g$[c] (ppm/°C.) | $\bar{a}_{260}$[d] (ppm/°C.) | $\epsilon'/\tan\delta$[e] 0% RH | 50% RH | H2O[g] absorption (wt %) |
| --- | --- | --- | --- | --- | --- | --- | --- |
| A | >300 | 169 ± 7 | 53 ± 2 | 61 ± 2 | 3.01/0.0004 | 3.05/0.003 | 0.20 |
| B | >300 | 191 ± 4 | 34 ± 3 | 53 ± 2 | 2.95/0.002 | 3.00 | 0.12 |

TABLE 9-continued

| Sample | Tg(°C.)[a] DSC | Tsp(°C.)[b] TMA | $\bar{\alpha}_g{}^c$ (ppm/°C.) | $\alpha_{260}{}^d$ (ppm/°C.) | ε'/tanδ[e] 0% RH | 50% RH | H2O[g] absorption (wt %) |
|---|---|---|---|---|---|---|---|
| | | | | | | | 0.001 |

[a] Glass transition temperature.
[b] Softening point.
[c] Coefficient of thermal expansion from 25° C. to Tsp.
[d] Coefficient of thermal expansion from 25° C. to 260° C.
[e] ε' is the dielectric constant, tanδ the dissipation factor, measured at 1 MHz, 25° C., two-fluid cell.
[f] Relative humidity.
[g] Weight gain after two weeks at 50% relative humidity.

EXAMPLE X

Synthesis of Styrene Terminated Tetraphenol Ethane (70% Vinylbenzyl/30% Propyl) (STTPE (70 VBz/30 Pr))

To a 2 L, 3 neck round bottom flask equipped with a stirring shaft, an addition funnel and a condenser was added 200.0 g tetraphenol ethane (TPE) (Mn=274, Mw=711) (0.284 mol), 1.88 g BHT (0.00852 mol) and 950 ml N-methyl pyrollidinone (NMP). Upon dissolution of the TPE, 212.37 g vinylbenzyl chloride (VBC) (1.39 mol) were added and the vessel flushed and placed under positive nitrogen pressure by means of a mineral oil bubbler. The solution was heated to 60° C. by a water bath and 91.05 g KOH (1.42 mol) dissolved in 200 ml of methanol were added dropwise over 1 hour. The mixture was kept at 60° C. for an additional 3.5 hours. 72 ml 1-bromopropane (0.80 mol) were then added. 38.97 g KOH (0.607 mol) dissolved in 90 ml methanol were then added dropwise over 30 minutes and the temperature maintained at 60° C. an additional 1.5 hours.

The mixture was cooled and 1 L toluene was added. The mixture was washed with 1×2.5 L water and 3×2.5 L 1M NaCl (aq). The organic phase was dried over sodium sulfate, slurried with Celite and filtered. 0.62 g BHT (0.002894 mol) were dissolved in the solution and the solvent was removed by rotary evaporation up to 40° C. at 3 torr leaving an extremely viscous brown resin, 80% yield. GPC analysis found Mn=618, Mw=960, dispersity 1.55; Infrared analysis indicates no residual hydroxyl (<0.5%); Ion Chromatography found: <1 ppm Cl−, 5 ppm Br−, <3 ppm SO4−2. STTPE (70 VBz/30 Pr) was cast neat without solvent and cured according to curing procedure hereinbefore set forth in the above examples. Analysis of the cured polymer disclosed the following properties.

EXAMPLE XI

Synthesis of Styrene Terminated Brominated Tetraphenol Ethane (70% Vinylbenzyl/30% Propyl) (STBTPE (70 VBz/30 Pr))

To a 2 L, 3 neck round bottom flask equipped with a stirring shaft, an addition funnel and acondenser was added 400.0 g brominated tetraphenol ethane (BTPE) (0.231 mol), 1.53 g BHT (0.00693 mol) and 770 ml N-methyl pyrollidinone (NMP). Upon dissolution of the BTPE, 172.70 g vinylbenzyl chloride (VBC) (1.13 mol) were added and the vessel flushed and placed under positive nitrogen pressure by means of a mineral oil bubbler. The solution was heated to 60° C. by a water bath and 74.04 g KOH (1.16 mol) dissolved in 165 ml of methanol were added dropwise over 30 minutes. The mixture was kept at 60° C. for an additional 3.5 hours. 59 ml 1-bromopropane (0.65 mol) were then added. 31.68 g KOH (0.494 mol) dissolved in 71 ml methanol were then added dropwise over 30 minutes and the temperature maintained at 60° C. an additional 1.5 hours.

The mixture was cooled and 1 L toluene was added. The mixture was washed with 1×2.5 L water and 3×2.5 L 1M NaCl (aq). The organic phase was dried over sodium sulfate slurried with Celite and filtered . 1 mole percent of t-butyl catechol was dissolved in the solution as a radical scavenger. Solvent was removed by rotary evaporation up to 40° C. at 3 torr leaving an extremely viscous dark resin, 94% yield. GPC analysis found Mn−716, Mw=1062, dispersity 1.48; Infrared analysis indicates low levels of hydroxyl (<5%); Ion Chromatography found: 5 ppm Cl−, 20 ppm Br−, 10 ppm SO4−2. STBTPE (70 VBz/30 Pr) was cast both neat and from toluene solution using the curing procedure hereinbefore set forth in the above examples. Analysis of the cured polymer disclosed the following prop-

TABLE 10

| Tg(°C.)[a] DSC | Tsp(°C.)[b] TMA | $\bar{\alpha}_g{}^c$ (ppm/°C.) | $\alpha_{260}{}^d$ (ppm/°C.) | ε'/tanδ[e] 0% RH | 50% RH | H2O[g] abosorption (wt %) |
|---|---|---|---|---|---|---|
| >300 | 146 ± 1 | 62 ± 3 | 76 ± 4 | 2.94/0.033 | 2.97/0.008 | 0.14 |

[a] Glass transition temperature.
[b] Softening point.
[c] Coefficient of thermal expansion from 25° C. to Tsp.
[d] Coefficient of thermal expansion from 25° C. to 260° C.
[e] ε' is the dielectric constant, tanδ the dissipation factor, measured at 1 MHz, 25° C., two-fluid cell.
[f] Relative humidity.
[g] Weight gain after two weeks at 50% relative humidity.

erties. Samples are identified as follows.
A: Cast neat without solvent
B: Cast from toluene

TABLE 11

| Sample | Tg(°C.)[a] DSC | Tsp(°C.)[b] TMA | $\bar{\alpha}_g{}^c$ (ppm/°C.) | $\alpha_{260}{}^d$ (ppm/°C.) | ε'/tanδ[e] 0% RH | 50% RH | H2O[g] absorption (wt %) |
|---|---|---|---|---|---|---|---|
| A | >300 | 205 ± 9 | 46 ± 2 | 58 ± 2 | 2.97/0.003 | 3.14/0.005 | 0.163 |

TABLE 11-continued

| Sample | Tg(°C.)[a] DSC | Tsp(°C.)[b] TMA | $\bar{\alpha}_g{}^c$ (ppm/°C.) | $\bar{\alpha}_{260}{}^d$ (ppm/°C.) | ε'/tanδ[e] 0% RH | 50% RH | H2O[g] absorption (wt %) |
|---|---|---|---|---|---|---|---|
| B | >300 | 191 ± 4 | 33 ± 2 | 60 ± 7 | 3.04/0.004 | 3.05 0.007 | 0.154 |

[a]Glass transition temperature.
[b]Softening point.
[c]Coefficient of thermal expansion from 25° C. to Tsp.
[d]Coefficient of thermal expansion from 25° C. to 260° C.
[e]ε' is the dielectric constant, tanδ the dissipation factor, measured at 1 MHz, 25° C., two-fluid cell.
[f]Relative humidity.
[g]Weight gain after two weeks at 50% relative humidity.

EXAMPLE XII

Synthesis of Styrene Terminated Brominated Tetraphenol Ethane (50% Vinylbenzyl/50% Propyl) (STBTPE (50 VBz/50 Pr))

To a 2 L, 3 neck round bottom flask equipped with a stirring shaft, an addition funnel and a condenser was added 324.1 g brominated tetraphenol ethane (BTPE) (0.187 mol), 1.24 g BHT (0.00561 mol) and 625 ml N-methyl pyrollidinone (NMP). Upon dissolution of the BTPE, 99.95 g vinylbenzyl chloride (VBC) (0.655 mol) were added and the vessel flushed and placed under positive nitrogen pressure by means of a mineral oil bubbler. The solution was heated to 60° C. by a water bath and 42.84 g KOH (0.668 mol) dissolved in 100 ml of methanol were added dropwise over 30 minutes. The mixture was kept at 60° C. for an additional 3.5 hours. 71 ml 1-bromopropane (0.78 mol) were then added. 42.84 g KOH (0.668 mol) dissolved in 100 ml methanol were then added dropwise over 30 minutes and the temperature maintained at 60° C. an additional 1.5 hours.

The mixture was cooled and 850 ml toluene were added. The mixture was washed with 1×2 L water and 2×2 L 1M NaCl (aq). The organic phase was dried over sodium sulfate slurried with Celite and filtered. 0.31 g t-butyl catechol (0.0019 mol) were dissolved in the solution as a radical scavenger. Solvent was removed by rotary evaporation up to 40° C. at 3 torr leaving an extremely viscous dark resin, 100% yield. GPC analysis found Mn=521, Mw=987, dispersity 1.89; Infrared analysis indicates low levels of hydroxyl (<5%); Ion Chromatography found: 5 ppm Cl−, 23 ppm Br−, 3 ppm SO4−2. STBTPE (50 VBz/50 Pr) was cast neat and cured according to the aforementioned cure cycle. The properties of the cured resin were:

EXAMPLE XIII

Synthesis of Styrene Terminated Tetraphenol Ethane (70% Vinylbenzyl/30% Propyl) (STTPE (70 VBz/30 Pr))

To a 3 L, 3 neck round bottom flask equipped with a stirring shaft, an addition funnel and a condenser was added 353.0 g tetraphenol ethane (TPE) (Mn=274, Mw=711) (0.500 mol), 3.30 g BHT (0.0150 mol) and 1670 ml N-methyl pyrollidinone (NMP). Upon dissolution of the TPE, 373.89 g vinylbenzyl chloride (VBC) (2.45 mol) were added and the vessel flushed and placed under positive nitrogen pressure by means of a mineral oil bubbler. The solution was heated to 60° C. by a water bath and 160.25 g KOH (2.50 mol) dissolved in 360 ml of methanol were added dropwise over 30 minutes. The mixture was kept at 60° C. for an additional 3.5 hours. 127 ml 1-bromopropane (1.40 mol) were then added. 68.68 g KOH (1.07 mol) dissolved in 150 ml methanol were then added dropwise over 30 minutes and the temperature maintained at 60° C. an additional 1.5 hours.

The mixture was cooled and 2 L toluene were added. The mixture was washed with 1×5 L water and 3×5 L 1M NaCl (aq). The organic phase was dried over sodium sulfate and filtered through Celite. 1 mole percent of t-butyl catechol was added as a radical scavenger. Solvent was removed by rotary evaporation up to 40° C. at 3 torr leaving an extremely viscous brown resin, 84% yield. GPC analysis found Mn=576, Mw=915, dispersity 1.59; Infrared analysis found no residual hydroxyl (<0.5%); Ion Chromatography found: 3 ppm Cl− 7 ppm Br−, 18 ppm SO4−2. STTPE (70 VBz/30 Pr) was cast neat without solvent and cured according to curing procedure hereinbefore set forth in the above examples. Analysis of the cured polymer disclosed the following properties.

TABLE 12

| Tg(°C.)[a] DSC | Tsp(°C.)[b] TMA | $\bar{\alpha}_g{}^c$ (ppm/°C.) | $\bar{\alpha}_{260}{}^d$ (ppm/°C.) | ε'/tanδ[e] 0% RH | 50% RH | H2O[g] absorption (wt %) |
|---|---|---|---|---|---|---|
| >300 | 143 ± 10 | 57 ± 4 | 101 ± 1 | 3.09/0.0004 | 3.16/0.0021 | 0.126 |

[a]Glass transition temperature.
[b]Softening point.
[c]Coefficient of thermal expansion from 25° C. to Tsp.
[d]Coefficient of thermal expansion from 25° C. to 260° C.
[e]ε' is the dielectric constant, tanδ the dissipation factor, measured at 1 MHz, 25° C., two-fluid cell.
[f]Relative humidity.
[g]Weight gain after two weeks at 50% relative humidity.

TABLE 13

| $T_g(°C.)^a$ DSC | $T_{sp}(°C.)^b$ TMA | $\overline{\alpha_g}^c$ (ppm/°C.) | $\overline{\alpha_{260}}^d$ (ppm/°C.) | $\epsilon'/\tan\delta^e$ 0% RH | $\epsilon'/\tan\delta^e$ 50% RH | $H_2O^g$ absorption (wt %) |
|---|---|---|---|---|---|---|
| >300 | 103 ± 11 | 63 ± 4 | 80 ± 1 | 2.97/0.001 | 3.02/0.001 | 0.24 |

[a] Glass transition temperature.
[b] Softening point.
[c] Coefficient of thermal expansion from 25° C. to Tsp.
[d] Coefficient of thermal expansion from 25° C. to 260° C.
[e] $\epsilon'$ is the dielectric constant, $\tan\delta$ the dissipation factor, measured at 1 MHz, 25° C., two-fluid cell.
[f] Realtive humidity.
[g] Weight gain after two weeks at 50% relative humidity.

EXAMPLE XIV

Synthesis of Styrene Terminated Tetraphenol Ethane (100% Vinylbenzyl) (STTPE (100 VBz))

To a 2 L, 3 neck round bottom flask equipped with a stirring shaft, an addition funnel and a condenser was added 200.0 g tetraphenol ethane (TPE) (Mn=274, Mw=711) (0.284 mol), 1.88 g BHT (0.00852 mol) and 950 ml N-methyl pyrollidinone (NMP). Upon dissolution of the TPE, 242.65 g vinylbenzyl chloride (VBC) (1.59 mol) were added and the vessel flushed and placed under positive nitrogen pressure by means of a mineral oil bubbler. The solution was heated to 60° C. by a water bath and 101.95 g KOH (1.59 mol) dissolved in 230 ml of methanol were added dropwise over 30 minutes. The mixture was kept at 60° C. for an additional 4.7 hours. 15.17 g VBC (0.0994 mol) were then added. 6.37 g KOH (0.0994 mol) dissolved in 15 ml methanol were then added dropwise. A final identical addition of VBC and KOH/methanol was made 1.7 hours later and the reaction maintained at 60° C. for 1 hour longer.

The mixture was cooled and 1.2 L toluene were added. The mixture was washed with 1×3 L water and 2×3 L 1M NaCl (aq). The organic phase was dried over sodium sulfate, slurried with Celite and filtered. Solvent was removed by rotary evaporation up to 40° C. at 3 torr leaving a viscous brown resin, 95% yield. GPC analysis found Mn=778, Mw=1079, dispersity 1.39; Infrared analysis indicates no residual hydroxyl (<0.5%); Ion Chromatography found: 45 ppm Cl−. STTPE (100 VBz) was cast neat without solvent and cured according to the curing procedure hereinbefore set forth in the above examples. Analysis of the cured polymer disclosed the following properties.

TABLE 14

| $T_g(°C.)^a$ DSC | $T_{sp}(°C.)^b$ TMA | $\overline{\alpha_g}^c$ (ppm/°C.) | $\overline{\alpha_{260}}^d$ (ppm/°C.) | $\epsilon'/\tan\delta^e$ 0% RH | $\epsilon'/\tan\delta^e$ 50% RH | $H_2O^g$ absorption (wt %) |
|---|---|---|---|---|---|---|
| >300 | h | h | h | 2.97/0.0004 | 3.03/0.003 | 0.236 |

[a] Glass transition temperature.
[b] Softening point.
[c] Coefficient of thermal expansion from 25° C. to Tsp.
[d] Coefficient of thermal expansion from 25° C. to 260° C.
[e] $\epsilon'$ is the dielectric constant, $\tan\delta$ the dissipation factor, measured at 1 MHz, 25° C., two-fluid cell.
[f] Relative humidity.
[g] Weight gain after two weeks at 50% relative humidity.
[h] Not determined.

What is claimed is:

1. A thermosetting resin of an ether of the oligomeric condensation product of:
   (a) 1 molar proportion of a dialdehyde; and
   (b) from about 3 to about 4 molar proportions of a phenol;
   where the dialdehyde is selected from the group consisting of $OHC(CH_2)_nCHO$, where n=0 or an integer from 1 to 6, cyclopentanedialdehyde, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde;
   where the phenol has the structure $R_1C_6H_4OH$ where $R_1$ is hydrogen or an alkyl group containing from 1 to about 10 carbon atoms; and
   where the phenol residue of said oligomeric condensation product is etherified with one or more substituents to afford ether moieties randomly selected from the group consisting of vinylbenzyl, alkyl moieties containing from 1 to 10 carbon atoms, cycloalkyl moieties of 5 to 10 carbon atoms, and benzyl, with the ratio of vinylbenzyl to other moieties being from 1:1 to about 6:1.

2. The resin of claim 1 where the dialdehyde is $OHC(CH_2)_nCHO$ and n is 0 or an integer from 1 to 4.

3. The resin of claim 2 where n is zero.

4. The resin of claim 1 where the phenol is phenol.

5. The resin of claim 1 where the phenol is cresol.

6. The resin of claim 1 further characterized in that each oligomeric condensation product has from about 4 to about 60 phenol moietes per molecule.

7. The resin of claim 6 where the condensation product has from 4 to about 22 phenolic moieties per molecule.

8. The resin of claim 7 further characterized in that the oligomeric condensation product has an average from about 5 to about 8 phenolic moieties per molecule.

9. The resin of claim 4 where the dialdehyde is glyoxal and further characterized in that the molecular weight of each oligomeric condensation product is from about 400 to about 6000.

10. The resin of claim 9 where the molecular weight of each oligomeric condensation product is from about 400 to about 2200.

11. The resin of claim 9 further characterized in that the average molecular weight of the oligomeric condensation product is from about 500 to about 800.

12. The resin of claim 1 further characterized in that each aromatic ring of the oligomeric condensation product has from 1 to about 3 bromine or chlorine atoms.

13. The resin of claim 12 where the dialdehyde is glyoxal and the phenol is phenol, and where each aromatic ring has from 1 to about 3 bromine or chlorine atoms.

14. The resin of claim 1 where the other ether moieties are selected from the group consisting of alkyl moieties having 1 through about 4 carbon atoms.

15. The resin of claim 1 where the alkyl moiety is a primary alkyl moiety.

16. A mixture of thermosetting resins of ethers of the oligomeric condensation products of:
   (a) 1 molar proportion of a dialdehyde; and
   (b) from about 3 to about 4 molar proportions of a phenol;
   where the dialdehyde is selected from the group consisting of $OHC(CH_2)_nCHO$, where $n=0$ or an integer from 1 to 6, cyclopentanedialdehyde, phthalaldehyde, isophthalaldehyde, terephthalaldehyde, hexahydrophthalaldehyde, cycloheptanedialdehyde, hexahydroisophthalaldehyde, hexahydroterephthalaldehyde, and cyclooctanedialdehyde,
   where the phenol has the structure $R_1C_6H_4OH$ where $R_1$ is hydrogen or an alkyl group containing from 1 to about 10 carbon atoms;
   and wherein the phenol residue of said oligomeric condensation product is etherified with one or more substituents to afford ether moieties randomly selected from the group consisting of vinylbenzyl, alkyl moieties containing from 1 to 10 carbon atoms, cycloalkyl moieties of 5 to 10 carbon atoms, and benzyl, with the ratio of vinylbenzyl to other moieties being from 1:1 to about 6:1.

17. The mixture of claim 16 where the dialdehyde is $OHC(CH_2)_nCHO$ and n is 0 or an integer from 1 to 4.

18. The mixture of claim 17 where n is zero.

19. The mixture of claim 16 where the phenol is phenol.

20. The mixture of claim 16 where the phenol is cresol.

21. The mixture of claim 16 further characterized in that each oligomeric condensation product has from about 4 to about 60 phenolic moieties per molecule.

22. The mixture of claim 21 where the condensation product has from 4 to about 22 phenolic moieties per molecule.

23. The mixture of claim 22 further characterized by having an average from about 5 to about 8 phenolic moieties per molecule.

24. The mixture of claim 19 where the dialdehyde is glyoxal and further characterized in that the molecular weight of each oligomeric condensation product is from about 400 to about 6000.

25. The mixture of claim 24 where the molecular weight of each oligomeric condensation product is from about 400 to about 2200.

26. The mixture of claim 24 further characterized by the condensation product having an average molecular weight of from about 500 to about 800.

27. The mixture of claim 16 further characterized in that each aromatic ring of the oligomeric condensation products has from 1 to about 3 bromine or chlorine atoms.

28. The mixture of claim 27 where the dialdehyde is glyoxal and the phenol is phenol, and where each aromatic ring has from 1 to about 3 bromine or chlorine atoms.

29. The mixture of claim 16 where the other ether moieties are selected from the group consisting of alkyl moieties having 1 through about 4 carbon atoms.

30. The mixture of claim 16 were the alkyl moiety is a primary alkyl moiety.

31. The polymer resulting from curing the mixture of resins of claim 16.

32. The polymer of claim 31 where curing is done thermally.

33. The polymer of claim 31 where curing is performed photochemically.

34. The polymer of claim 31 where the resin has been cured with the aid of a free radical initiator.

* * * * *

UNITED STATES PATENT AND TRADEMARK OFFICE
CERTIFICATE OF CORRECTION

PATENT NO. : 4,816,498

DATED : March 28, 1989

INVENTOR(S) : Zupancic et al.

It is certified that error appears in the above-identified patent and that said Letters Patent is hereby corrected as shown below:

Column 2, line 33: "prevents" should read --presents--.
Column 5, line 8 (formula diagram): "CH-C" should read --CH-CH--;
          line 25: "molecular" should read --molecule--.
Column 9, line 32: "an" should read --and--;
          line 38: "(21 5%)" should read --(<5%)--.
Column 11, Table 4: "3.17     0.007" should read --3.17/0.007--.
Column 12, line 11: "(0.742 m mol)" should read --(0.742 mol)--;
          line 31: insert --,-- after "Cl-";
          Table 5: "3.10     0.002" should read --3.10/0.002--.
          Table 5: "3.07     0.003" should read --3.07/0.003--.
Column 13, line 24: "moL" should read --mol--;
Column 13 line 43: delete "," before "3 ppm";
          Table 6: "3.02     0.004" should read --3.02/0.004--.
Column 14, line 29: "as" should read --at--.

UNITED STATES PATENT AND TRADEMARK OFFICE
CERTIFICATE OF CORRECTION

PATENT NO. : 4,816,498
DATED : March 28, 1989
INVENTOR(S) : Zupancic et al.

It is certified that error appears in the above-identified patent and that said Letters Patent is hereby corrected as shown below:

Column 14,15, Table 7: "3.04       should read --3.04/0.006--.
                       0.006"
Column 15, Table 8:    before "8" insert --TABLE-- in heading;
Column 15, Table 8:    "3.02       should read 3.02/0.044.
                       0.044
Column 16, line 21:    "ad" should read --and--.
Column 16,17, Table 9: "3.00       should read --3.00/0.001--.
                       0.001"
Column 17, Table 10 (line 2): "abosorption" should read --absorption--.
Column 18, line 19:    "acondenser" should read --a condenser--;
         line 43:      "Mn-716" should read --Mn=716--.
Column 19, Table 11:   "3.05       should read --3.05/0.007--.
                       0.007"
Column 20, line 49:    after "Cl$^-$" insert --,--.
In Tables 3 thru 14:   "0% RH" should read --0% RH$^f$--.

Signed and Sealed this

Seventeenth Day of October, 1989

Attest:

DONALD J. QUIGG

Attesting Officer    Commissioner of Patents and Trademarks